United States Patent
Sugitani et al.

(10) Patent No.: US 11,882,756 B2
(45) Date of Patent: Jan. 23, 2024

(54) DISPLAY APPARATUS AND METHOD OF MANUFACTURING THE SAME

(71) Applicant: Samsung Display Co., Ltd., Yongin-si (KR)

(72) Inventors: Koichi Sugitani, Yongin-si (KR); Hyein Kim, Yongin-si (KR); Gwuihyun Park, Yongin-si (KR); Chulwon Park, Yongin-si (KR); Hyungbin Cho, Yongin-si (KR); Pilsoon Hong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/949,664

(22) Filed: Sep. 21, 2022

(65) Prior Publication Data

US 2023/0053442 A1    Feb. 23, 2023

Related U.S. Application Data

(62) Division of application No. 16/895,614, filed on Jun. 8, 2020, now Pat. No. 11,469,376.

(30) Foreign Application Priority Data

Nov. 12, 2019   (KR) .......................... 10-2019-0143933

(51) Int. Cl.
*H10K 71/00*       (2023.01)
*H10K 59/12*       (2023.01)
(Continued)

(52) U.S. Cl.
CPC .......... *H10K 71/621* (2023.02); *H10K 59/12* (2023.02); *H10K 85/40* (2023.02); *H10K 50/844* (2023.02); *H10K 59/1201* (2023.02); *H10K 71/00* (2023.02)

(58) Field of Classification Search
None
See application file for complete search history.

(56) References Cited

U.S. PATENT DOCUMENTS 7,122,467 B2   10/2006   Lee et al.
7,384,872 B2    6/2008   Hwang et al.
(Continued)

FOREIGN PATENT DOCUMENTS

KR      10-0601954      7/2006
KR      10-0611777      8/2006
(Continued)

*Primary Examiner* — Michelle Mandala
(74) *Attorney, Agent, or Firm* — KILE PARK REED & HOUTTEMAN PLLC

(57) ABSTRACT

Provided are a display apparatus and a method of manufacturing the same. The display apparatus includes a substrate, a first conductive layer disposed on the substrate, and a first insulating pattern disposed on the first conductive layer. The first insulating pattern includes a fluorine compound and a nitrogen compound. The nitrogen compound is represented by Formula 1:

$$NR_1R_2R_3OH \qquad \text{<Formula 1>}$$

wherein in Formula 1, $R_1$ to $R_3$ are each independently selected from hydrogen, a substituted or unsubstituted $C_1$-$C_{20}$ alkyl group, a substituted or unsubstituted $C_6$-$C_{30}$ aryl group, and a substituted or unsubstituted $C_7$-$C_{30}$ aralkyl group.

17 Claims, 8 Drawing Sheets

(51) Int. Cl.
*H10K 85/40* (2023.01)
*H10K 50/844* (2023.01)

(56) References Cited

U.S. PATENT DOCUMENTS

| | | | |
|---|---|---|---|
| 8,937,313 | B2 | 1/2015 | Chung et al. |
| 8,992,806 | B2 | 3/2015 | Li et al. |
| 9,299,559 | B2 | 3/2016 | Draeger et al. |
| 9,590,177 | B2 | 3/2017 | Fang et al. |
| 10,192,957 | B2 * | 1/2019 | Baeck ............... H01L 29/41775 |
| 2006/0255735 | A1 | 11/2006 | Moriya et al. |
| 2009/0101911 | A1 * | 4/2009 | Kim .................... H01L 29/4908 |
| | | | 257/66 |
| 2012/0228602 | A1 | 9/2012 | Nakatani et al. |
| 2013/0175534 | A1 * | 7/2013 | Chung ................ H01L 27/1218 |
| | | | 977/890 |
| 2018/0026141 | A1 | 1/2018 | Ikeda et al. |
| 2019/0189713 | A1 | 6/2019 | Kondo |
| 2019/0252477 | A1 * | 8/2019 | Yu ....................... H01L 27/1274 |
| 2019/0319131 | A1 | 10/2019 | Uraoka et al. |
| 2019/0334125 | A1 | 10/2019 | Hosono et al. |
| 2021/0091262 | A1 * | 3/2021 | Wu ......................... H01L 33/30 |

FOREIGN PATENT DOCUMENTS

| | | |
|---|---|---|
| KR | 10-2013-0101479 | 9/2013 |
| KR | 10-1324022 | 11/2013 |
| KR | 10-1852196 | 4/2018 |
| KR | 10-1903445 | 10/2018 |

* cited by examiner

DISPLAY APPARATUS AND METHOD OF MANUFACTURING THE SAME

CROSS-REFERENCE TO RELATED APPLICATION(S)

This is a divisional application of U.S. patent application Ser. No. 16/895,614 filed Jun. 8, 2020 (now pending), the disclosure of which is incorporated herein by reference in its entirety. U.S. patent application Ser. No. 16/895,614 claims the priority to and benefits of Korean Patent Application No. 10-2019-0143933 under 35 U.S.C. § 119, filed on Nov. 12, 2019 in the Korean Intellectual Property Office (KIPO), the entire contents of which are incorporated herein by reference.

BACKGROUND

1. Technical Field

Embodiments of the disclosure relate to a display apparatus, and to a display apparatus that is capable of preventing or reducing the deterioration of image quality during a manufacturing process or use.

2. Description of the Related Art

Display apparatuses have been diversified in use. In recent developments, the thickness of the display apparatuses is smaller and the weight thereof is lighter, and thus, they are used in a wider range of use. For example, the use of display apparatuses is expanding to not only small devices such as MP3 players and mobile phones, but also medium and large devices such as big-screen televisions.

In addition, there has been research and development of foldable or rollable display apparatuses. To this end, it is desirable to improve the flexibility of substrates of display apparatuses.

SUMMARY

Embodiments of the disclosure provide a display apparatus that is capable of preventing or reducing the deterioration of image quality during a manufacturing process or use and a method of manufacturing the same.

Technical objectives to be achieved by the disclosure are not limited to the above-mentioned embodiments, and other technical objectives which have not been described will be clearly understood by those skilled in the art from the description of the disclosure.

Additional aspects will be set forth in part in the description which follows and, in part, will be apparent from the description, or may be learned by practice of the presented embodiments of the disclosure.

In one embodiment, a display apparatus may include a substrate, a first conductive layer disposed on the substrate, and a first insulating pattern disposed on the first conductive layer, wherein the first insulating pattern includes a fluorine compound.

In one embodiment, concentration of the fluorine compound may be reduced from a first surface of the first insulating pattern to a second surface of the first insulating pattern, and the first surface faces the second surface.

In one embodiment, the second surface of the first insulating pattern is in contact with the conductive layer.

In one embodiment, the first insulating pattern may further include a nitrogen compound.

In one embodiment, the nitrogen compound may be represented by Formula 1.

$$NR_1R_2R_3OH \qquad \text{<Formula 1>}$$

In Formula 1, $R_1$ to $R_3$ may each independently be selected from hydrogen, a substituted or unsubstituted $C_1$-$C_{20}$ alkyl group, a substituted or unsubstituted $C_6$-$C_{30}$ aryl group, and a substituted or unsubstituted $C_7$-$C_{30}$ aralkyl group.

In one embodiment, concentration of the nitrogen compound may be reduced from a first surface of the first insulating pattern to a second surface of the first insulating pattern, wherein the first surface faces the second surface.

In one embodiment, the first insulating pattern may further include a nitrogen compound and a first material, and the first material may be different from the fluorine compound and the nitrogen compound.

In one embodiment, the first insulating pattern consists essentially of the first material.

In one embodiment, the first material may be an alkali soluble polymer.

In one embodiment, the first material may be a siloxane-based polymer.

In one embodiment, the first insulating pattern includes a first region and a second region, the second region may be between the first conductive layer and the first region, and an amount of the first material in the first region may be greater than an amount of the first material in the second region.

In one embodiment, a ratio of the amount of the fluorine compound in the first region to the amount of the fluorine compound in the second region may be from about 10:1 to about 10,000:1.

In one embodiment, a ratio of the thickness of the first region to the thickness of the second region may be from about 1:10 to about 1:1,000.

In one embodiment, the first conductive layer may include molybdenum, aluminum, titanium, neodymium, copper, or a combination thereof.

In one embodiment, the display apparatus may further include a pixel electrode that is disposed on the first insulating pattern and electrically connected to the first conductive layer.

In one embodiment, the first insulating pattern may include an opening that exposes a portion of the first conductive layer, and the pixel electrode may contact the first conductive layer through the opening.

In one embodiment, a portion of the first conductive layer exposed by the opening may include molybdenum.

In one embodiment, the display apparatus may further include a second insulating pattern disposed on the pixel electrode and contacts the first insulating pattern outside the pixel electrode.

In one embodiment, the first insulating pattern may include a first material, the second insulating pattern may include a second material, and the first material and the second material may comprise a same material.

In one embodiment, a method of manufacturing a display apparatus includes forming a first conductive layer on a substrate, forming a preliminary first insulating pattern on the first conductive layer, forming a first insulating pattern by developing with a first solution, and treating the first insulating pattern with a second solution, wherein the first solution includes a nitrogen compound and the second solution includes HF.

In one embodiment, the method may further include, prior to the treating, forming a pixel electrode on the first insulating pattern wherein the pixel electrode may be electrically connected to the first conductive layer.

In one embodiment, the method may further include, after the treating, forming a pixel electrode on the first insulating pattern wherein the pixel electrode is electrically connected to the first conductive layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
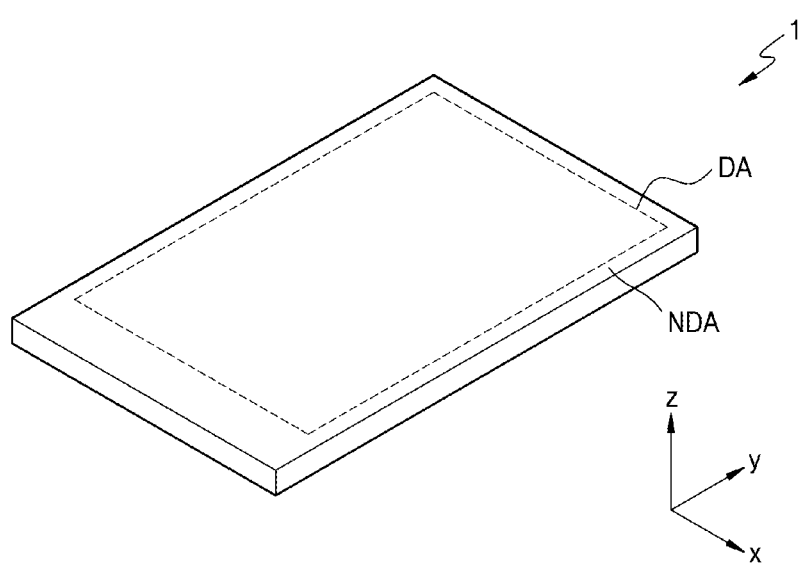
FIG. 1 is a schematic perspective view showing a display apparatus according to an embodiment.

Reference will now be made in detail to the embodiments, examples of which are illustrated in the accompanying drawings, wherein like reference numerals refer to like elements throughout. In this regard, the embodiments may have various modifications and different forms and should not be construed as being limited to the descriptions set forth herein. Rather, all modifications, equivalents, and substituents which are included in the spirit and technical scope of the invention should be included. Accordingly, the embodiments are merely described below, by referring to the figures, to explain aspects of the description.

Hereinafter, embodiments of the disclosure will be described in detail with reference to the accompanying drawings. The same or corresponding components will be denoted by the same reference numerals, and thus redundant description thereof will be omitted.

As used herein, the term "and/or" includes any and all combinations of one or more of the associated listed items. Throughout the disclosure, the expression "at least one of a, b or c" may indicate only a, only b, only c, both a and b, both a and c, both b and c, all of a, b, and c, or variations thereof.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "contains," "containing," "includes," "including," "comprises," and/or "comprising" used herein specify the presence of stated features or components, but do not preclude the presence or addition of one or more other features or components.

It will be understood that when a layer, region, or component is referred to as being "on" or "onto" another layer, region, or component, it may be directly or indirectly formed on the other layer, region, or component. For example, intervening layers, regions, or components may be present. It will also be understood that when a layer, region, or component is referred to as being "directly on" or "directly onto" another layer, region, or component, it may be directly formed on the other layer, region, or component, and intervening layers, regions, or components may not be present.

Sizes of elements in the drawings may be exaggerated for convenience of explanation. In other words, since sizes and thicknesses of components in the drawings are arbitrarily illustrated for convenience of explanation, the following embodiments of the disclosure are not limited thereto.

When an embodiment is implementable otherwise, a particular process order may be performed differently from the order described. For example, two processes described in succession may be performed substantially simultaneously or in a reverse order.

It will be understood that when a layer, region, or component is referred to as being "connected to" another layer, region, or component, the layer, region, or component may be directly connected to the another layer, region, or component, or indirectly connected to the another layer, region, or component as intervening layer, region, or component is present. For example, it will be understood that when a layer, region, or component is referred to as being "electrically connected to" another layer, region, or component, the layer, region, or component may be directly electrically connected to the another layer, region, or component, or indirectly electrically connected to the another layer, region, or component as intervening layer, region, or component is present.

The term "$C_1$-$C_{20}$ alkyl group" as used herein refers to a linear or branched aliphatic saturated hydrocarbon monovalent group having 1 to 20 carbon atoms, and examples thereof include a methyl group, an ethyl group, a propyl group, an isobutyl group, a sec-butyl group, a tert-butyl group, a pentyl group, an isoamyl group, and a hexyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group.

The term "$C_6$-$C_{30}$ aryl group" as used herein refers to a monovalent group having a carbocyclic aromatic system having 6 to 30 carbon atoms. Examples of the $C_6$-$C_{30}$ aryl group include a phenyl group, a naphthyl group, an anthracenyl group, a phenanthrenyl group, a pyrenyl group, and a chrysenyl group. When the $C_6$-$C_{30}$ aryl group includes two or more rings, the rings may be fused to each other.

The term "$C_7$-$C_{30}$ aralkyl group" as used herein refers to a group having 7 to 30 carbon atoms in which the alkyl group is substituted with the aryl group. Examples of the $C_7$-$C_{60}$ aralkyl group include a benzyl group.

FIG. 1 is a schematic perspective view showing a display apparatus 1 according to an embodiment.

Referring to FIG. 1, the display apparatus 1 includes a display area DA and a non-display area NDA outside the display area DA. In the display area DA, various display devices such as an organic light-emitting device (OLED) may be positioned or disposed. In the non-display area NDA, various wires through which electrical signals are transmitted to the display area DA may be positioned or disposed.

Although FIG. 1 illustrates the display apparatus 1 including a rectangular display area DA, the invention is not limited thereto. The shape of the display area DA may be a circle, an ellipse, or a polygon such as a triangle or a pentagon.

Although the display apparatus 1 of FIG. 1 is a display apparatus having a flat shape, the display apparatus 1 may be implemented in various forms such as a curved display apparatus, a flexible display apparatus, a foldable display apparatus, and a rollable display apparatus.

Hereinafter for convenience, an organic light-emitting display apparatus will be described as an example of the display apparatus 1 according to an embodiment, but the display apparatus according to the disclosure is not limited thereto. In one or more embodiments, various other display apparatuses, such as an inorganic light-emitting display apparatus or a quantum dot light-emitting display apparatus, may instead be used.

Figure 2:
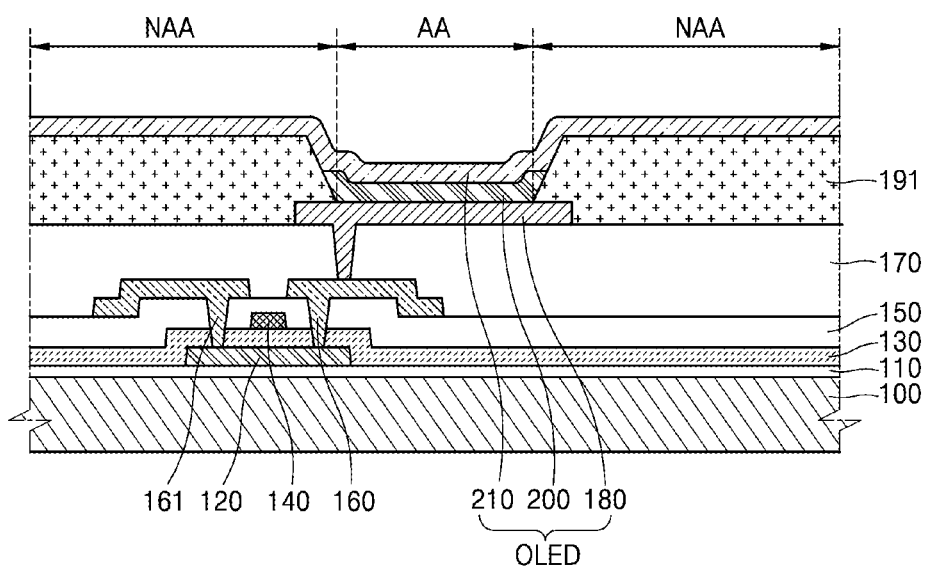
FIG. 2 is a schematic cross-sectional view showing a display apparatus according to an embodiment.

FIG. 2 is a schematic cross-sectional view showing the display apparatus 1 according to an embodiment.

Referring to FIG. 2, the display apparatus 1 according to an embodiment includes a substrate 100, a first conductive layer 160 disposed on the substrate 100; and a first insulating pattern 170 disposed on the first conductive layer 160.

The substrate 100 may include various materials, such as glass, metal, metal oxide, metal nitride, or plastic. For example, the substrate 100 may include polyethersulfone, polyacrylate, polyetherimide, polyethylene napthalate, polyethyeleneterepthalate, polyphenylene sulfide, polyarylate, polyimide, polycarbonate, cellulose acetate propionate, or the like.

The substrate 100 may be flexible, rollable, or bendable. The substrate 100 may have a multi-layered structure, and layers constituting the multilayer structure may have different materials.

A buffer layer 110 may be disposed on the substrate 100 to planarize the top surface of the substrate 100 and to block impurities from flowing from the substrate 100. The buffer layer 110 may have a single-layered structure or a multi-layered structure, each structure including an inorganic material such as silicon nitride ($SiN_x$) and/or silicon oxide ($SiO_x$). The buffer layer 110 may be omitted.

An activation layer 120 may be disposed on the buffer layer 110. The activation layer 120 may include organic semiconductors, inorganic semiconductors, and/or silicon semiconductors.

A first insulating layer 130 may be disposed on the activation layer 120, and a gate electrode 140 may be disposed on the first insulating layer 130.

The first insulating layer 130 may include at least one insulating film selected from $SiO_2$, $SiN_x$, SiON, $Al_2O_3$, $TiO_2$, $Ta_2O_5$, $HfO_2$, $ZrO_2$, BST, and PZT in the form of a single layer or multiple layers. The first insulating layer 130 may be an inorganic insulating film.

The gate electrode 140 may include aluminum (Al), platinum (Pt), palladium (Pd), silver (Ag), magnesium (Mg), gold (Au), nickel (Ni), neodymium (Nd), iridium (Ir), and chromium (Cr), lithium (Li), calcium (Ca), molybdenum (Mo), titanium (Ti), tungsten (W), copper (Cu), or any combination thereof, in the form of a single layer or multiple layers. The gate electrode 140 may be connected to a gate line through which an electrical signal is applied thereto.

The first conductive layer 160 and/or a second conductive layer 161 may be disposed on the gate electrode 140 with a second insulating layer 150 therebetween. The first conductive layer 160 and/or the second conductive layer 161 may be electrically connected to the activation layer 120 through contact holes formed in the second insulating layer 150 and the first insulating layer 130.

The first conductive layer 160 may include aluminum (Al), platinum (Pt), palladium (Pd), silver (Ag), magnesium (Mg), gold (Au), nickel (Ni), neodymium (Nd), iridium (Ir), and chromium (Cr), lithium (Li), calcium (Ca), molybdenum (Mo), titanium (Ti), tungsten (W), copper (Cu), or any combination thereof, in the form of a single layer or multiple layers. For example, the first conductive layer 160 may have a three-layered Mo/Al/Mo, Mo/Al/Ti, or Ti/Al/Ti structure. In an embodiment, the first conductive layer 160 may include a Mo/Al/Ti structure. The composition and structure of the second conductive layer 161 may be understood by referring to the description of the first conductive layer 160.

The first insulating pattern 170 may be disposed on the second insulating layer 150.

In one embodiment, the first insulating pattern 170 may include a fluorine compound.

In one embodiment, the concentration of the fluorine compound may be reduced from a first surface of the first insulating pattern 170 to a second surface of the first insulating pattern 170, wherein the first surface faces the second surface.

The first insulating pattern 170 may be formed from a preliminary first insulating pattern and developing the same with an alkaline solution containing a nitrogen compound. A residual amount of the nitrogen compound may remain in the first insulating pattern 170, which may reduce the lifespan of a display apparatus. To minimize residual nitrogen compounds, a treatment is performed thereon with a solution containing HF. Due to the HF used in the treatment, fluorine compounds derived from HF may be included in the first insulating pattern 170. Although the amount of the fluorine compound is not limited, the amount of the fluorine compound included therein may be substantially zero or a relatively small amount. Although the amount of the nitrogen compound is not limited, the amount of the nitrogen compound included therein may be substantially zero or a relatively small amount.

For example, the amount of the fluorine compound in the first insulating pattern 170 may be less than about 1 wt %.

In one or more embodiments, the amount of the fluorine compound in the first insulating pattern 170 may be less than or equal to about 0.5 wt %.

In one embodiment, the first insulating pattern 170 may further include a nitrogen compound.

For example, the amount of the nitrogen compound in the first insulating pattern 170 may be less than about 1 wt %.

In one or more embodiments, the amount of the nitrogen compound in the first insulating pattern 170 may be less than or equal to about 0.5 wt %.

In one embodiment, the concentration of the nitrogen compound may be reduced from a first surface of the first insulating pattern 170 to the other a second surface of the first insulating pattern 170, wherein the first surface faces the second surface.

As described above, since the fluorine compound is derived from the HF contained in the solution used for the treatment, the concentration of the fluorine compound may be the highest on the surface of the first insulating pattern 170 which is in direct contact with the solution. In one embodiment, the concentration of the fluorine compound may be reduced from a first surface of the first insulating pattern 170 to a second surface of the first insulating pattern 170, wherein the first surface faces the second surface. The second surface of the first insulating pattern 170 may be in contact with the first conductive layer 160.

In one embodiment, the first insulating pattern 170 may not include the nitrogen compound. Herein, the absence of the nitrogen compound may indicate that the nitrogen compound is included in the first insulating pattern 170 in an amount that is less than the detection limit of detection equipment.

The nitrogen compound may be represented by Formula 1:

$$NR_{11}R_{12}R_{13}OH \qquad \text{<Formula 1>}$$

In Formula 1, $R_{11}$ to $R_{13}$ may each independently be selected from hydrogen, a substituted or unsubstituted $C_1$-$C_{20}$ alkyl group, a substituted or unsubstituted $C_6$-$C_{30}$ aryl group, and a substituted or unsubstituted $C_7$-$C_{30}$ aralkyl group.

For example, $R_{11}$ to $R_{13}$ in Formula 1 may each independently be selected from hydrogen, a methyl group, an ethyl group, an n-propyl group, an iso-propyl group, an n-butyl group, an iso-butyl group, a sec-butyl group, a tert-butyl group, and a benzyl group.

In one or more embodiments, the nitrogen compound may be tetramethylammonium hydroxide (TMAH), tetraethylammonium hydroxide (TEAH), tetrapropylammonium hydroxide (TPAH), tetrabutylammonium hydroxide (TBAH), benzyltrimethylammonium hydroxide, benzyltriethylammonium hydroxide, or any combination thereof.

The first insulating pattern 170 may further include the nitrogen compound and a first material, wherein the first material is different from the fluorine compound and the nitrogen compound. In an embodiment, the first insulating pattern 170 may consist essentially of the first material. Herein, the phrase "consist essentially of the first material" may indicate that the nitrogen compound and the fluorine compound are included in the first insulating pattern 170 in amounts that are less than the detection limit of detection equipment.

For example, the amount of the first material in the first insulating pattern 170 may be greater than or equal to about 98 wt %. In one or more embodiments, the amount of the first material in the first insulating pattern 170 may be greater than about 99 wt %.

The first material may be an alkali soluble polymer. In one embodiment, the first material may be a siloxane-based polymer, but embodiments of the disclosure are not limited.

For example, the first material may include a repeating unit represented by Formula 2, but embodiments of the disclosure are not limited:

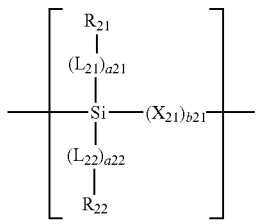

<Formula 2>

In Formula 2, $L_{21}$ and $L_{22}$ may each independently be $C(R_{23})(R_{24})$ or O—Si—O, a21 and a22 may each independently be 0, 1, 2, or 3, $X_{21}$ may be O or O—Si—O, b21 may be 1, 2, or 3, and $R_{21}$ to $R_{24}$ may each independently be selected from hydrogen, a hydroxyl group, a substituted or unsubstituted $C_1$-$C_{20}$ alkyl group, a substituted or unsubstituted $C_3$-$C_{10}$ cycloalkyl group, a substituted or unsubstituted $C_6$-$C_{30}$ aryl group, and a substituted or unsubstituted $C_7$-$C_{30}$ aralkyl group.

In one embodiment, the first material may have an average molecular weight of about 1,000 to about 15,000, but embodiments of the disclosure are not limited thereto. In one embodiment, the first material may have a weight average molecular weight of about 1,000 to about 10,000.

As described above, since the nitrogen compound is included in a developer, the concentration of the nitrogen compound may be the highest on the surface of a preliminary first insulating pattern which is in direct contact with the developer. In one embodiment, the concentration of the nitrogen compound may be reduced from a first surface of the first insulating pattern 170 to a second surface of the first insulating pattern 170, where the first surface faces the second surface. The second surface of the first insulating pattern 170 may be in contact with the first conductive layer 160.

For example, the first insulating pattern 170 may include a first region and a second region. The second region may be between the first conductive layer 160 and the first region, and the amount of the first material in the first region may be greater than the amount of the first material in the second region.

In one embodiment, the ratio of the amount of the fluorine compound in the first region to the amount of the fluorine compound in the second region may be from about 10:1 to about 10,000:1, but embodiments of the disclosure are not limited thereto.

The ratio of the thickness of the first region to the thickness of the second region may be from about 1:10 to about 1:1,000, but embodiments of the disclosure are not limited. A surface of the second region may contact the first conductive layer 160.

In one embodiment, the ratio of the amount of the nitrogen compound in the first region to the amount of the nitrogen compound in the second region may be from about 10:1 to about 10,000:1, but embodiments of the disclosure are not limited thereto.

The ratio of the thickness of the first region to the thickness of the second region may be from about 1:10 to about 1:1,000, but embodiments of the disclosure are not limited. The surface of the second region may contact the first conductive layer 160.

In one embodiment, the first insulating pattern 170 may have a first opening that exposes a portion of the first conductive layer 160, and a pixel electrode 180 may contact the first conductive layer 160 through the first opening of the first insulating pattern 170. In one embodiment, the portion of the first conductive layer 160 exposed by the first opening may include molybdenum (Mo). In one embodiment, the first conductive layer 160 may have a Mo/Al/Ti structure, and the portion of the first conductive layer 160 exposed by the first opening may include Mo. Since Mo has a relatively high resistance to HF (for example, higher resistance to HF than Ti), even though the first conductive layer 160 is exposed to HF during the manufacture of the display apparatus 1, the deterioration of the display apparatus 1 may be relatively small or absent.

When an organic light-emitting device OLED is a top emission type light-emitting device, the pixel electrode 180 may be formed as a reflective electrode. The reflective electrode may include Ag, Mg, Al, Pt, Pd, Au, Ni, Nd, Ir, Cr, or any combination thereof in the form of a single layer or multiple layers. For example, the reflective electrode may include a reflective layer including Ag, Mg, Al, Pt, Pd, Au, Ni, Nd, Ir, Cr, or any combination thereof, and a transparent or semi-transparent electrode layer formed on the reflective layer.

When the organic light-emitting device OLED is a bottom emission type light-emitting device, the pixel electrode 180 may include a transparent material such as ITO, IZO, ZnO, or $In_2O_3$, and may be formed as a transparent or semi-transparent electrode. For example, the pixel electrode 180 may have a stacked structure of ITO/Ag/ITO.

A second insulating pattern 191 may be disposed on the pixel electrode 180 and may contact the first insulating pattern 170 outside the pixel electrode 180. The second insulating pattern 191 may have a second opening exposing a portion of the pixel electrode 180, for example, a center portion thereof. As a result, a light-emitting area is defined in a pixel.

The second insulating pattern 191 may include a siloxane-based polymer, an imide polymer, an amide polymer, an olefin polymer, an acrylic polymer, a phenol polymer, or any combination thereof.

In one embodiment, the first insulating pattern 170 may include the first material, the second insulating pattern 191 may include a second material, and the first material and second material may comprise a same material. In one embodiment, the first material may be identical to the second material. In one embodiment, the first material and the second material may each be a siloxane-based polymer, but embodiments of the disclosure are not limited. On the cross-section of the display apparatus 1, a boundary between the first insulating pattern 170 and the second insulating pattern 191 may be substantially absent or not observed.

The organic light-emitting device OLED may include the pixel electrode 180 disposed on the first insulating pattern 170, an opposite electrode 210 facing the pixel electrode 180, and a middle layer 200 between the pixel electrode 180 and the opposite electrode 210.

The middle layer 200 includes an emission layer that emits light, and at least one functional layer selected from a hole injection layer (HIL), a hole transport layer (HTL), an electron transport layer (ETL), and an electron injection layer (EIL). However, the embodiment is not limited thereto, and various other functional layers may be disposed on the pixel electrode 180.

The emission layer may be a red emission layer, a green emission layer, or a blue emission layer. In one or more embodiments, the emission layer may have a multi-layered structure in which a red emission layer, a green emission layer, and a blue emission layer are stacked to emit white light, or may have a single-layered structure including a red light-emitting material, a green light-emitting material, and a blue light-emitting material.

In one embodiment, the middle layer 200 may be provided only to an emission area AA by using a mask having an opening corresponding to the emission area AA of the display apparatus 1, for example, a fine metal mask (FMM).

In one or more embodiments, the emission layer of the middle layer 200 is provided only to the emission area AA by using an FMM having an opening corresponding to the emission area AA of the display apparatus 1, and the other functional layers thereof may be provided to the emission area AA and a non-emission area NAA by using an open mask.

The opposite electrode 210 may be disposed on the middle layer 200. The opposite electrode 210 may be a reflective electrode, a transparent electrode, or a semi-transparent electrode. For example, the opposite electrode 210 may include a metal having a small work function, and may include Li, Ca, LiF/Ca, LiF/Al, Al, Ag, Mg, or any combination thereof.

Although not shown in FIG. 2, an opposite substrate may be further provided on the opposite electrode 210. The opposite substrate may be understood by referring to the description provided in connection with the substrate 100.

Although not shown in FIG. 2, a black matrix BM and a color filter CF may be disposed on a surface of the opposing substrate facing the substrate 100. The color filter CF may be arranged to correspond to the emission area AA of the display apparatus 1. The black matrix BM may be disposed to correspond to a region other than the emission area AA of display apparatus 1.

Although not shown in FIG. 2, a protective layer may be disposed between the opposite substrate and the opposite electrode 210. The protective layer may include an inorganic film and/or an organic film in the form of one or more layers.

Although not shown in FIG. 2, various functional layers may be further provided on the opposite substrate. For example, a functional layer may be an anti-reflection layer that minimizes reflection on the upper surface of the opposite substrate, or an anti-fouling layer that prevents contamination, such as marks made by the hands of a user (for example, fingerprints).

In one or more embodiments, instead of the opposite substrate, a thin film encapsulation layer may be disposed on the substrate 100. The thin film encapsulation layer may include an inorganic encapsulation layer including at least one inorganic material and an organic encapsulation layer including at least one organic material. In one or more embodiments, the thin film encapsulation layer may have a stacked structure of a first inorganic encapsulation layer/an organic encapsulation layer/a second inorganic encapsulation layer.

Figure 3:
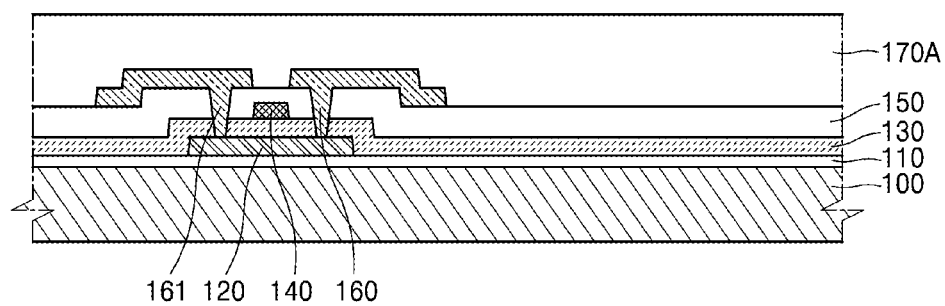
FIGS. 3 to 5 are schematic cross-sectional views illustrating a method of manufacturing a display apparatus according to an embodiment.
Figure 4:
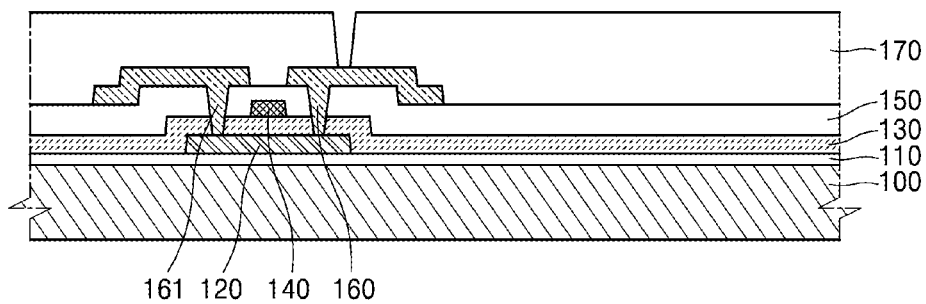
Figure 5:
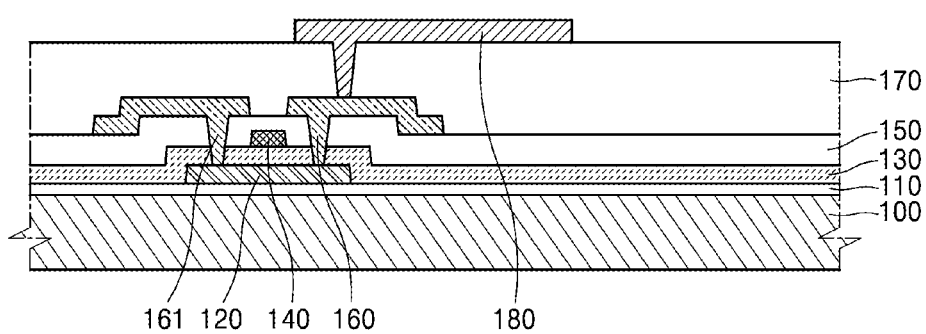

Hereinafter, a method of manufacturing the display apparatus 1 will be described with reference to FIGS. 3 to 5. FIGS. 3 to 5 are schematic cross-sectional views illustrating a method of manufacturing the display apparatus 1 according to an embodiment.

Referring to FIGS. 3 to 5, a method of manufacturing the display apparatus 1 according to an embodiment includes: providing the substrate 100; forming a first conductive layer 160 disposed on the substrate 100; forming a preliminary first insulating pattern 170A on the first conductive layer 160; forming a first insulating pattern 170 by developing with a first solution; and treating the first insulating pattern 170 with a second solution, wherein the first solution includes a nitrogen compound and the second solution includes HF.

For example, the first conductive layer 160 may be formed by a dry process. Materials included in the first conductive layer 160 are the same as described above.

For example, the preliminary first insulating pattern 170A may be formed by spin coating or screen printing a composition including the first material.

In one embodiment, the preliminary first insulating pattern 170A may be exposed through a mask having an opening prior to the development using the first solution. As a light source used for the exposure, a low pressure mercury lamp, a high pressure mercury lamp, an ultra high pressure mercury lamp, a metal halide lamp, an argon gas laser, etc. may be used, and ultraviolet rays, an X-ray, an electron beam, etc. may also be used. The exposure intensity depends on the type of components included in the preliminary first insulating pattern 170A, the mixed ratio of the components, and a dry-film thickness thereof. For example, the exposure intensity may be from about 10 mW/cm³ to about 50 mW/cm³ (by a 365 nm sensor), and the irradiation time may be from about 5 seconds to about 1 minute, but embodiments of the disclosure are not limited thereto.

The developing is performed using the first solution to form the first insulating pattern 170. The nitrogen compound in the first solution may be understood to be the same as described above, and may be an alkaline aqueous solution. The amount of the nitrogen compound in the first solution may be from about 0.1 wt % to about 5 wt %. In one embodiment, the amount of the nitrogen compound in the first solution may be from about 2 wt % to about 3 wt %. However, embodiments of the disclosure are not limited thereto.

The first insulating pattern 170 may be cured. The curing method may be thermosetting or photocuring, and is not specifically limited thereto. In one embodiment, the first insulating pattern 170 may be thermally cured at about 200° C. to about 270° C. By curing the first insulating pattern 170, the heat resistance, light resistance, adhesion, crack resistance, chemical resistance, strength, storage stability, and the like of the first insulating pattern 170 may be improved.

In one embodiment, a residue may be removed by dry etching. When the first insulating pattern 170 is formed by developing using the first solution, the first insulating pattern 170 may be left undesirably on the first conductive layer 160. Dry etching may be performed to remove the residues that may remain on the first conductive layer 160. Dry etching may be performed using oxygen ($O_2$) gas or $CF_4$ gas, but embodiments of the disclosure are not limited.

The second solution may be used for a treatment. Since the treatment is performed using the second solution, the first insulating pattern 170 may not include the nitrogen compound, or the amount of the nitrogen compound in the first insulating pattern may be less than about 1 wt %. As a result, the deterioration of the display apparatus 1 when the treatment is performed with the second solution may be relatively lower than that when the treatment with the second solution is not performed.

In one embodiment, when the display apparatus 1 is treated with the second solution, the lifespan thereof may be increased to at least twice that of the display apparatus 1 when the treatment using the second solution is not performed. The HF of the second solution may inhibit a hydrogen bond that may be formed between the first material and the nitrogen compound in the first insulating pattern 170. As a result, the concentration of the nitrogen compound in the first insulating pattern 170 may be lowered. As an example, when the preliminary first insulating pattern 170A is a siloxane-based polymer, the surface of the preliminary first insulating pattern 170A may have an OH group. When the siloxane-based polymer is treated with the first solution including a nitrogen compound having an OH group such as TMAH, a hydrogen bond may be formed between the OH group of the siloxane-based polymer and the OH group of TMAH. When the resultant structure is treated with the second solution containing HF, the hydrogen bond may be inhibited, and accordingly, the concentration of the nitrogen compound in the first insulating pattern 170 may be lowered.

For example, the second solution may include a buffer oxide etchant (BOE), but embodiments of the disclosure are not limited thereto.

In one embodiment, the method may further include, prior to the treating, forming the pixel electrode 180 that is disposed on the first insulating pattern 170 and is electrically connected to the first conductive layer 160. In this embodiment, since the first conductive layer 160 is not substantially exposed to the second solution, the material included in the first conductive layer 160 is not limited.

In one embodiment, the method may further include, after the treating, forming the pixel electrode 180 that is disposed on the first insulating pattern 170 and is electrically connected to the first conductive layer 160. In this embodiment, since a portion of the first conductive layer 160 is exposed to the second solution, the material included in the first conductive layer 160 may have a relatively high resistance to HF. In one embodiment, the portion of the first conductive layer 160 exposed by the first opening may include molybdenum (Mo).

The display apparatus 1 may be embodied as an electronic device 1000, such as a mobile phone, a video phone, a Smartphone, a smart pad, a smart watch, a tablet PC, a laptop computer, a computer monitor, a television, a digital broadcasting terminal, a personal digital assistant (PDA), a portable multimedia player (PMP), a head mounted display (HMD), a vehicle navigation apparatus, or the like.

Figure 6:
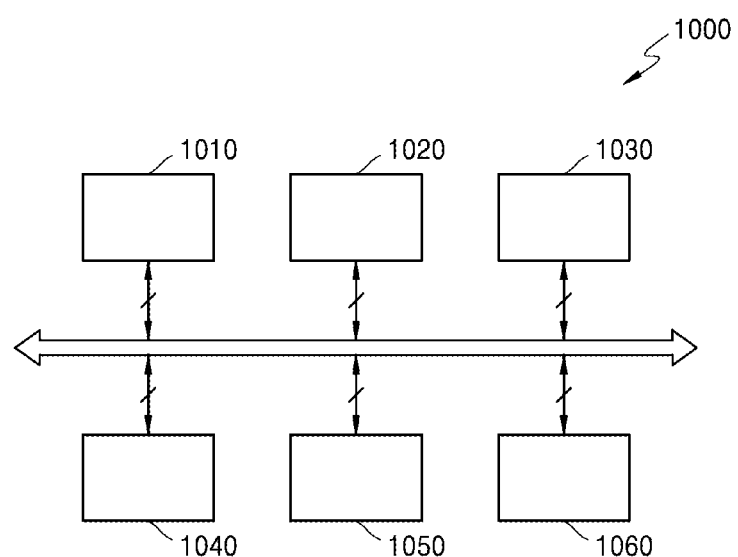
FIG. 6 is a schematic block diagram showing the structure of an electronic device apparatus according to an embodiment.
Figure 7A:
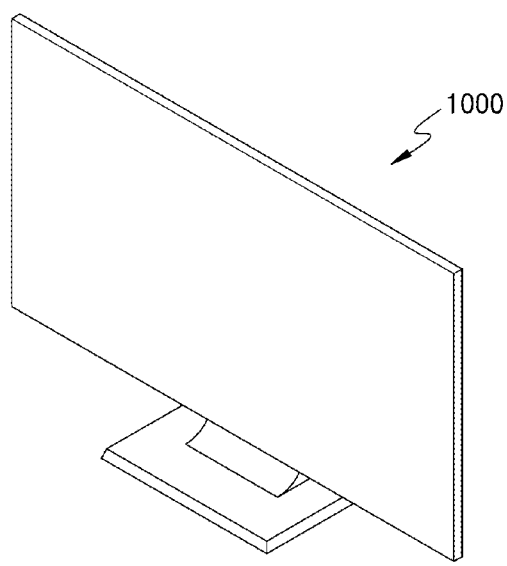
FIGS. 7A and 7B are schematic perspective views showing an electronic device according to an embodiment.
Figure 7B:
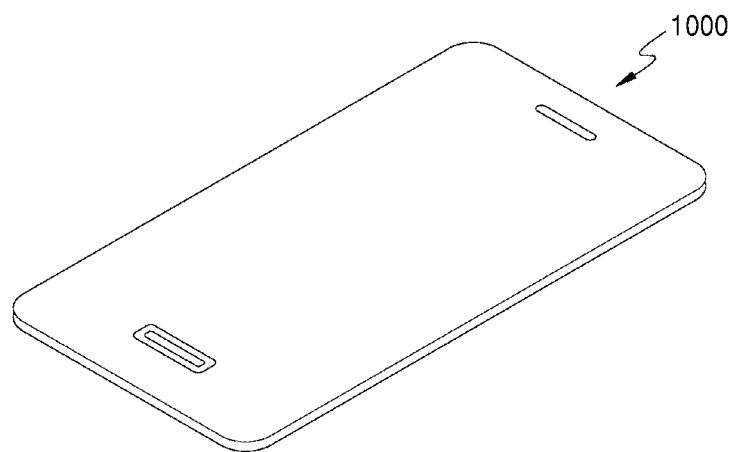

FIG. 6 is a schematic block diagram showing the structure of the electronic device 1000 according to an embodiment; and FIGS. 7A and 7B are schematic perspective views showing an electronic device 1000 according to an embodiment of the disclosure.

Referring to FIG. 6, the electronic device 1000 may include a processor 1010, a memory apparatus 1020, a storage apparatus 1030, an input/output apparatus 1040, a power supply 1050, and a display apparatus 1060. The display apparatus 1060 may correspond to the display apparatus 1 of FIG. 1. The electronic device 1000 may further include various ports that communicate with a video card, a sound card, a memory card, a USB apparatus, or the like, or that are capable of communicating with other systems.

In one embodiment, as shown in FIG. 7A, the electronic device 1000 may be implemented as a television. In one embodiment, as shown in FIG. 7B, the electronic device 1000 may be implemented as a smartphone. However, these are illustrative examples of the electronic device 1000, and embodiments of the disclosure are not limited thereto.

According to various embodiments of the disclosure, a display apparatus that is capable of preventing or reducing the deterioration of image quality during a manufacturing process or use and a method of manufacturing the display apparatus are provided.

However, the above-described effects are an example, and the effects of the embodiments will be described in detail with reference to the following description.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus, the method comprising:
   forming a conductive layer on a substrate;
   forming a preliminary insulating pattern on the conductive layer;
   forming an insulating pattern by developing with a first solution; and treating the insulating pattern with a second solution, wherein the preliminary insulating pattern comprises a first material, the first material being a siloxane-based alkali soluble polymer, the first solution comprises a nitrogen compound, the second solution comprises HF, the first material is different from the nitrogen compound, the insulating pattern comprises a first region and a second region, the second region is between the conductive layer and the first region, and the concentration of the nitrogen compound is reduced from the first region to the second region.

2. The method of claim 1, wherein
the siloxane-based alkali soluble polymer comprises a repeating unit represented by Formula 2:

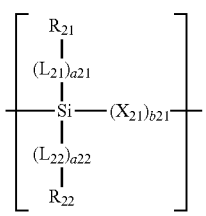

<Formula 2> in Formula 2, $L_{21}$ and $L_{22}$ is each independently $C(R_{23})(R_{24})$ or O—Si—O, a21 and a22 is each independently be 0, 1, 2, or 3, $X_{21}$ is O or O—Si—O, b21 is 1, 2, or 3, and $R_{21}$ to $R_{24}$ is each independently selected from hydrogen, a hydroxyl group, a substituted or unsubstituted $C_1$-$C_{20}$ alkyl group, a substituted or unsubstituted $C_3$-$C_{10}$ cycloalkyl group, a substituted or unsubstituted $C_6$-$C_{30}$ aryl group, and a substituted or unsubstituted $C_7$-$C_{30}$ aralkyl group.

3. The method of claim 1, wherein
the nitrogen compound is represented by Formula 1:

 <Formula 1> in Formula 1, $R_1$ to $R_3$ is each independently selected from hydrogen, a substituted or unsubstituted $C_1$-$C_{20}$ alkyl group, a substituted or unsubstituted $C_6$-$C_{30}$ aryl group, and a substituted or unsubstituted $C_7$-$C_{30}$ aralkyl group.

4. The method of claim 3, wherein
the nitrogen compound includes tetramethylammonium hydroxide (TMAH), tetraethylammonium hydroxide (TEAH), tetrapropylammonium hydroxide (TPAH), tetrabutylammonium hydroxide (TBAH), benzyltrimethylammonium hydroxide, benzyltriethylammonium hydroxide, or any combination thereof.

5. The method of claim 1, wherein
the second solution comprises a buffer oxide etchant (BOE).

6. The method of claim 1, wherein
an amount of the first material in the first region is greater than an amount of the first material in the second region.

7. The method of claim 6, wherein
a ratio of the amount of the fluorine compound in the first region to the amount of the fluorine compound in the second region is from about 10:1 to about 10,000:1.

8. The method of claim 6, wherein
the amount of HF in the insulating pattern is less than about 1 wt %.

9. The method of claim 6, wherein
the amount of the nitrogen compound in the insulating pattern is less than about 1 wt %.

10. The method of claim 6, wherein
a ratio of the thickness of the first region to the thickness of the second region is from about 1:10 to about 1:1,000.

11. The method of claim 1, wherein
the conductive layer includes aluminum (Al), platinum (Pt), palladium (Pd), silver (Ag), magnesium (Mg), gold (Au), nickel (Ni), neodymium (Nd), iridium (Ir), and chromium (Cr), lithium (Li), calcium (Ca), molybdenum (Mo), titanium (Ti), tungsten (W), copper (Cu), or any combination thereof.

12. The method of claim 1, wherein
the conductive layer is a single layer or multiple layers.

13. The method of claim 1, wherein
the conductive layer has a three-layered Mo/Al/Mo, Mo/Al/Ti, or Ti/Al/Ti structure.

14. The method of claim 13, wherein
the top of the conductive layer comprises molybdenum (Mo).

15. The method of claim 1, wherein
the insulating pattern comprises the opening that exposes a portion of the conductive layer.

16. The method of claim 15, further comprising,
prior to the treating, forming a pixel electrode on the insulating pattern, wherein the pixel electrode is electrically connected to the conductive layer.

17. The method of claim 15, further comprising,
after the treating, forming a pixel electrode on the insulating pattern, wherein the pixel electrode is electrically connected to the conductive layer.

* * * * *